(12) United States Patent
Choi et al.

(10) Patent No.: US 7,622,379 B2
(45) Date of Patent: Nov. 24, 2009

(54) METHODS OF FORMING METAL CONTACT STRUCTURES AND METHODS OF FABRICATING PHASE-CHANGE MEMORY DEVICES USING THE SAME

(75) Inventors: Suk-Hun Choi, Gyeonggi-do (KR); Byeong-ok Cho, Seoul (KR); Yoon-ho Son, Gyeonggi-do (KR); Sang-don Nam, Seoul (KR)

(73) Assignee: Samsung Electronics Co., Ltd. (KR)

( * ) Notice: Subject to any disclaimer, the term of this patent is extended or adjusted under 35 U.S.C. 154(b) by 616 days.

(21) Appl. No.: 11/084,505

(22) Filed: Mar. 18, 2005

(65) Prior Publication Data

US 2006/0024950 A1 Feb. 2, 2006

(30) Foreign Application Priority Data

Aug. 2, 2004 (KR) .................. 10-2004-0060912

(51) Int. Cl.
*H01L 21/4763* (2006.01)
(52) U.S. Cl. ...................................... 438/622
(58) Field of Classification Search ............ 438/692, 438/637, 95, 622–629, 672, 675; 257/3
See application file for complete search history.

(56) References Cited

U.S. PATENT DOCUMENTS

| 5,291,066 A | * | 3/1994 | Neugebauer et al. ........ 257/750 |
| 5,502,008 A | * | 3/1996 | Hayakawa et al. .......... 438/675 |
| 5,741,741 A | * | 4/1998 | Tseng ........................ 438/637 |
| 5,747,379 A | | 5/1998 | Huang et al. |
| 5,760,475 A | * | 6/1998 | Cronin et al. ............... 257/758 |
| 6,613,604 B2 | * | 9/2003 | Maimon et al. ............... 438/95 |
| 7,071,485 B2 | * | 7/2006 | Takaura et al. ................ 257/3 |
| 7,196,010 B2 | * | 3/2007 | Park et al. ................... 438/692 |
| 2002/0113273 A1 | * | 8/2002 | Hwang et al. ............... 257/374 |

FOREIGN PATENT DOCUMENTS

| KR | 1020020068746 A | 8/2002 |
| KR | 1020030081900 A | 10/2003 |
| WO | WO 2004/055825 | 7/2004 |

OTHER PUBLICATIONS

Notice to Submit a Response for Korean Patent Application No. 10-2004-0060912 mailed on Feb. 24, 2006.

* cited by examiner

*Primary Examiner*—Leonardo Andújar
*Assistant Examiner*—Monica D Harrison
(74) *Attorney, Agent, or Firm*—Myers Bigel Sibley & Sajovec, P.A.

(57) ABSTRACT

Methods of forming a metal contact structure include forming an interlayer insulating layer on a substrate, etching the interlayer insulating layer to form a hole, depositing a metal layer on the surface of the interlayer insulating layer including inside the hole, planarizing the metal layer to provide a buried portion of the metal layer in the hole and to remove portions of the metal layer outside of the hole, etching-back the buried portion of the metal layer in the hole such that some of the portion of the metal layer within the hole remains and depositing a conductive layer on the surface of the interlayer insulating layer and the portion of the metal layer that remains within the hole. Methods of forming a phase change memory device are also provided.

15 Claims, 8 Drawing Sheets

METHODS OF FORMING METAL CONTACT STRUCTURES AND METHODS OF FABRICATING PHASE-CHANGE MEMORY DEVICES USING THE SAME

CROSS REFERENCE TO RELATED APPLICATIONS AND CLAIM OF PRIORITY

This application is related to and claims priority from Korean Patent Application No. 2004-60912, filed on Aug. 2, 2004, in the Korean Intellectual Property Office, the disclosure of which is incorporated herein in its entirety by reference.

FIELD OF THE INVENTION

The present invention relates to methods of manufacturing semiconductor devices, and more particularly to methods of forming a metal contact structure included to a semiconductor device and a method of fabricating the semiconductor device, especially, a phase-change memory using the same.

BACKGROUND OF THE INVENTION

Generally, an interconnect structure is constructed by an interconnect horizontally elongated on a substrate, and a contact structure that connects an active region or a lower conductive layer of the substrate, which is the final destination of electrical signals, to the interconnect in a vertical direction. As used herein, the term contact structure refers to a contact plug, a contact pad, etc., and a metal contact structure refers to a contact structure that includes, at least partially, a metal.

Figure 1:
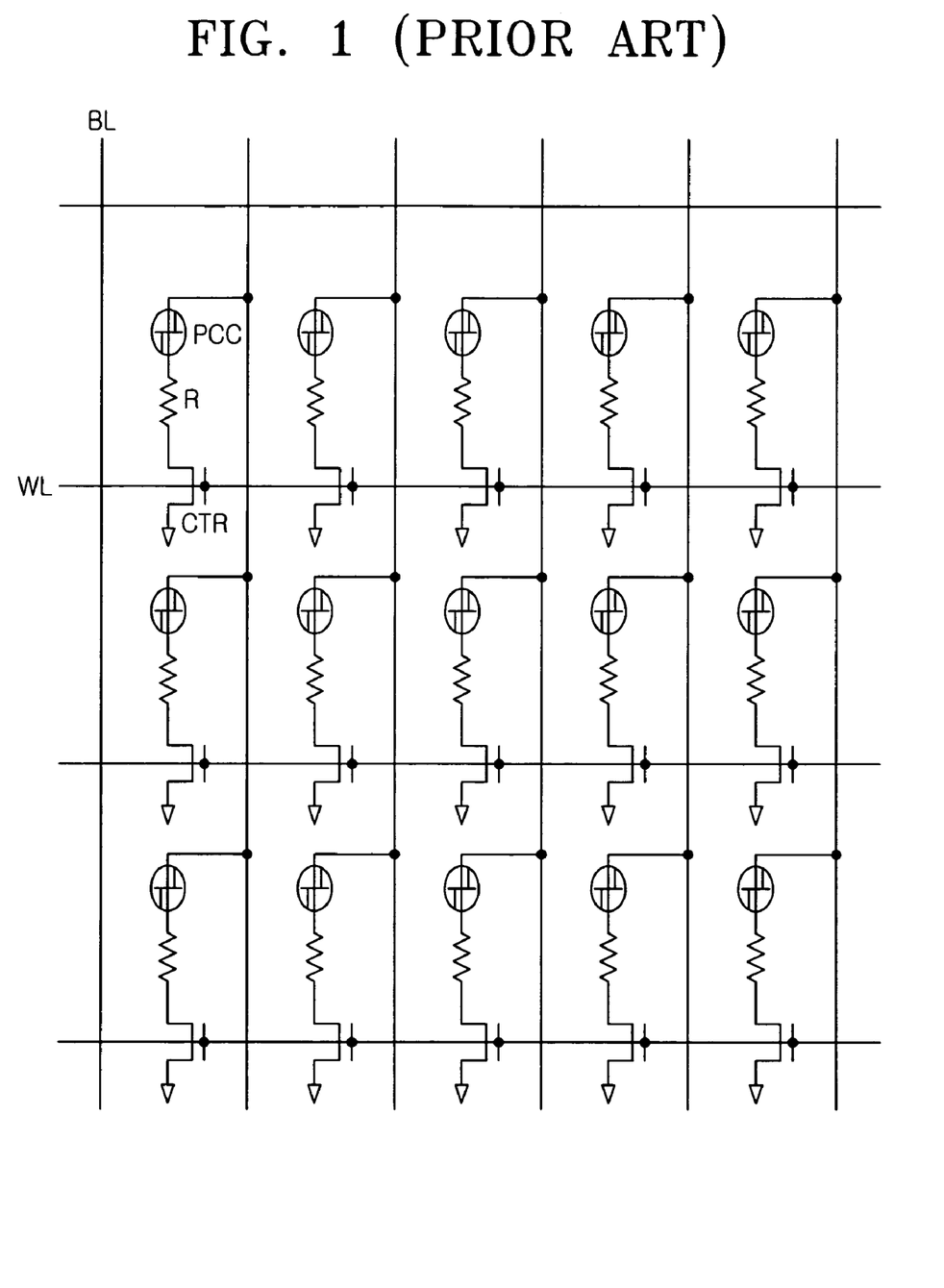
FIG. 1 is a schematic diagram of a conventional phase-change memory cell array structure.

A phase-change memory refers to a device that uses a phase-change layer, typically composed of chalcogenide, with an electrical resistance varied in accordance with a crystalline state for a memory cell. Phase-change memories are currently of interest because of non-volatilization, low power dissipation, high reliability, high device integration, etc. Phase-change memories typically use the Joule heating resulting from a current as a heat source for changing the phase of a portion of the phase-change material. FIG. 1 shows a conventional phase-change memory cell array structure.

Referring to FIG. 1, a memory cell has a single transistor CTR with a word line WL connected to a gate of the single transistor CTR, and a phase-change cell PCC serially connected with a resistor R between a drain of the cell transistor CTR and a bit line BL. When a word line WL and a bit line BL are selected, a current is applied to a selected phase-change cell PCC to change a crystalline structure of the phase-change cell PCC.

When actually driving the phase-change memory, a high current pulse of about 2 mA is applied from a transistor disposed under the phase-change layer to the phase-change layer for about 50 ns via the contact structure (including a metal contact plug, a metal pad and a lower electrode contact), thereby heating a portion of the phase-change material to a melting point Tm. Then, when application of the pulse is stopped, the phase change material rapidly cools and a contact portion of a phase-change layer is set to an amorphous state, which provides a high resistance. This state is referred to as reset, which is defined as storing data "1," for example. Under this condition, a current pulse of about 0.1 mA is applied from the transistor under the phase-change layer to the phase-change layer via the contact structure, and the phase-change layer is cooled after maintaining a crystallization temperature for from hundreds of nanoseconds to several microseconds. Then, the contact portion of a phase-change layer that was set to an amorphous state (e.g, the programming area) is restored to a crystalline state with a low resistance. This state is referred to as set, which is defined as storing data "0," for example. When reading out the stored data, a current lower than a reset current $I_{reset}$ and a set current $I_{set}$ is applied to confirm the change of the resistance.

Generally, the metal contact structure of the semiconductor device is formed by sputtering using aluminum (Al). However, a metal contact hole typically has a gradually decreased dimension resulting as a result of attaining high integration of the semiconductor device, which in turn impedes the step coverage of the aluminum contact. To solve this problem, forming a tungsten contact with a high contact resistant characteristic is used. Tungsten (W) is a heat-resistant metal with a high melting point, which has an excellent thermal stability with respect to silicon and a low resistivity of about 5~10/ μΩcm.

However, increased packing density of semiconductor devices may gradually decrease line width of interconnects, and increase the aspect ratio of the contact hole. Accordingly, problems may occur when forming the metal contact structure composed of tungsten. For example, contact resistance may be increased due to the decreased contact area, and a void or a seam may be produced when depositing a metal in a narrow and deep contact hole which may increase the contact resistance or degrade reliability of the contact.

The metal contact structure having the void or the seam as described above may be particularly problematic in a phase-change memory. In a phase-change memory, a phase-change layer is typically disposed on a contact structure that typically includes a metal contact plug, a metal pad, and a lower electrode contact, in which respective contacts should be ohmic contacts having little or no resistance error. However, if the void or seam is formed in the lower electrode contact, the phase-change layer may fill the void or seam. In this case, the contact area with the phase-change layer and the lower electrode contact is increased, thereby degrading an operating characteristic of the phase-change memory cell. If the seam is involved in the metal contact plug or metal pad, the seam is further enlarged by CMP, subsequent etching and wet cleaning. In particular, when the seam is formed in the metal pad, the lower electrode contact becomes directly in contact with an upper surface of the seam while the lower electrode contact is formed in the center of an upper surface of the metal pad, thereby causing a resistance error which may degrade yield.

A method is suggested in order to address the generation of the seam in the metal contact structure. In such a method, an entrance of a contact hole is enlarged using Ar sputtering (RF cleaning) after etching the contact hole for burying the metal contact structure therein. Thus, a position of the seam may be reliably produced when tungsten is filled in the contact hole in a subsequent process is moved to an upper portion of the contact plug to reduce frequency of the seam generation. Furthermore, an off-axis lower electrode contact structure is suggested. In such a structure, even though a seam is formed in a metal pad, the position of forming the lower electrode contact on the metal pad is changed from the center to the side not to contact the seam. However, several processing steps are added to further complicate the overall process.

SUMMARY OF THE INVENTION

Some embodiments of the present invention provide methods of forming a metal contact structure that include forming an interlayer insulating layer on a substrate, etching the interlayer insulating layer to form a hole, depositing a metal layer on the surface of the interlayer insulating layer including inside the hole, planarizing the metal layer to provide a buried portion of the metal layer in the hole and to remove portions of the metal layer outside of the hole, etching-back the buried portion of the metal layer in the hole such that some of the portion of the metal layer within the hole remains and depositing a conductive layer on the surface of the interlayer insulating layer and the portion of the metal layer that remains within the hole.

In further embodiments of the present invention, depositing the conductive layer is followed by planarizing the conductive layer formed on the surface of the interlayer insulating layer to remove portions of the conductive layer to provide a contact structure comprising the portion of the metal layer that remains in the hole and a remaining portion of the conductive layer in the hole and forming an upper conductive layer on the contact structure.

In some embodiments of the present invention, planarizing the metal layer and planarizing the conductive layer are carried out by Chemical Mechanical Polishing (CMP). Furthermore, the metal layer, the conductive layer, and/or the upper conductive layer may include tungsten (W). In particular embodiments of the present invention, the metal layer comprises tungsten, and the conductive layer comprises W, TiN, TiAlN and/or TaN.

In additional embodiments of the present invention, planarizing the metal layer is followed by removing a polymer-induced impurity from a surface of the metal layer filled in the hole. Removing the polymer-induced impurity may be provided by ashing the polymer-induced impurity and/or irradiating an RF plasma on the surface of the metal layer filled in the hole. Removing the polymer-induced impurity and etching-back the metal layer may be performed in-situ.

In further embodiments of the present invention where the metal layer comprises tungsten, etching-back the metal layer comprises plasma etching using $SF_6$ or $NF_3$ as an etchant. In some embodiments, $Cl_2$ may be added to the etchant.

In still further embodiments of the present invention, the metal layer is etched-back until a seam generated in the surface of the metal layer is removed.

In some embodiments of the present invention, depositing the metal layer is preceded by forming a barrier metal layer on the surface of the interlayer insulating layer including inside of the hole. In such a case, depositing the metal layer comprises depositing the metal layer on the barrier metal layer. The barrier metal layer may include a Ti layer, a TiN layer, a stacked layer of Ti and TiN, a Ta layer, a TaN layer and/or a stacked layer of Ta and TiN. Depositing the conductive layer may also be preceded by forming a second barrier metal layer on the surface of the interlayer insulating layer and the portion of the metal layer that remains within the hole. In such a case, depositing the conductive layer comprises depositing the conductive layer on the second barrier layer. The second barrier metal layer may include a Ti layer, a TiN layer, a stacked layer of Ti and TiN, a Ta layer, a TaN layer and/or a stacked layer of Ta and TiN.

Some embodiments of the present invention provide methods of fabricating a phase-change memory that include forming a first interlayer insulating layer on a substrate having a contact plug, etching the first interlayer insulating layer to form a contact hole that exposes the contact plug, depositing a metal layer on the surface of the first interlayer insulating layer including inside of the contact hole, planarizing the metal layer to provide a buried portion of the metal layer in the contact hole and to remove portions of the metal layer outside of the contact hole, etching-back the buried portion of the metal layer in the hole such that some of the portion of the metal layer within the hole remains, depositing a conductive layer on the surface of the first interlayer insulating layer and the portion of the metal layer that remains within the hole, planarizing the conductive layer to remove portions of the conductive layer formed on an upper surface of the first interlayer insulating layer to provide a contact pad comprising the portions of the metal layer and the conductive layer in the contact hole, forming a second interlayer insulating layer on the first interlayer insulating layer including the contact pad, forming a lower electrode contact in the second interlayer insulating layer and in contact with an upper surface of the contact pad and sequentially forming a phase-change layer, an upper electrode layer and an upper electrode contact layer on the lower electrode contact.

Planarizing the metal layer and planarizing the conductive layer may be carried out by Chemical Mechanical Polishing (CMP). The metal layer may include tungsten, and the conductive layer may include W, TiN, TiAlN and/or TaN. Planarizing the metal layer may be followed by removing a polymer-induced impurity existing on a surface of the metal layer filled in the contact hole. Removing the polymer-induced impurity may include ashing the polymer-induced impurity and/or irradiating an RF plasma on the surface of the metal layer filled in the contact hole. Removing the polymer-induced impurity and etching-back the metal layer filled in the contact hole may be performed in-situ.

In further embodiments of the present invention, the metal layer comprises tungsten, and etching-back the metal layer comprises plasma etching using $SF_6$ or $NF_3$ as an etchant. In some embodiments, $Cl_2$ is added to the etchant.

In additional embodiments of the present invention, the metal layer is etched-back until a seam generated in the surface of the metal layer is removed.

In further embodiments of the present invention, depositing the metal layer is preceded by forming a barrier metal layer on the surface of the first interlayer insulating layer including inside of the contact hole. In such a case, depositing the metal layer comprises depositing the metal layer on the barrier metal layer. The barrier metal layer may include a Ti layer, a TiN layer, a stacked layer of Ti and TiN, a Ta layer, a TaN layer and/or a stacked layer of Ta and TiN. Furthermore, depositing the conductive layer may be preceded by forming a second barrier metal layer on the surface of the first interlayer insulating layer and the portion of the metal layer that remains within the hole. In such as case, depositing the conductive layer comprises depositing the conductive layer on the second barrier layer. The second barrier metal layer may include a Ti layer, a TiN layer, a stacked layer of Ti and TiN, a Ta layer, a TaN layer and/or a stacked layer of Ta and TiN.

In still further embodiments of the present invention, forming the lower electrode contact comprises forming a lower electrode contact hole in the second interlayer insulating layer, forming a stacked layer of Ti and TiN on the surface of the second interlayer insulating layer including in the lower electrode contact hole and planarizing the stacked layer of Ti and TiN to provide a portion of the stacked layer of Ti and TiN in the lower electrode contact hole. Forming the stacked layer of Ti and TiN may be preceded by forming an insulating layer spacer along an inner wall of the lower electrode contact hole.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 2 through 7 are sectional views showing methods of forming metal contact structures according to some embodiments of the present invention.

Figure 2:
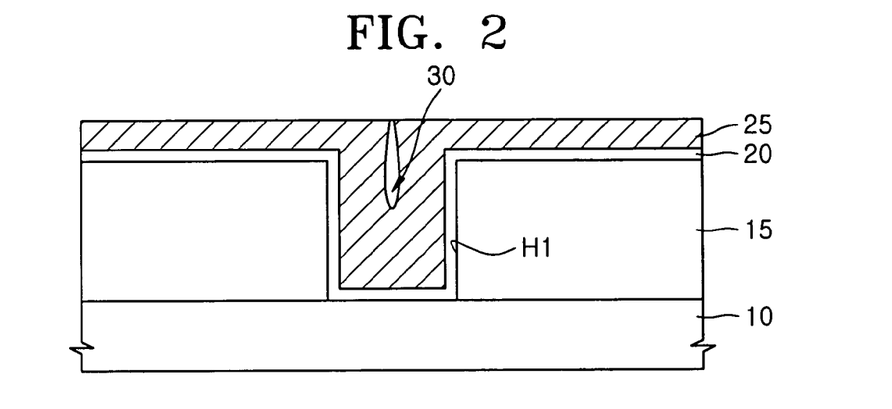
FIGS. 2 through 7 are sectional views showing methods of forming a metal contact structure according to some embodiments of the present invention.

Referring to FIG. 2, an interlayer insulating layer 15 is formed on a substrate 10, such as a silicon wafer. The interlayer insulating layer 15 is etched to form a hole H1. The interlayer insulating layer 15 comprise a silicon oxide layer using Boron Phosphorus Silicate Glass (BPSG), Spin On Glass (SOG), Undoped Silicate Glass (USG), Si—O—H-based Flowable OXide (FOX) and an oxide layer formed by High Density Plasma-CVD (HDP-CVD), and an oxide layer formed by Plasma Enhanced-CVD (PE-CVD) using tetra-ethylorthosilicate (TEOS). The hole H1 may expose an active region of the substrate 10, a lower interconnect layer or another contact structure.

A first barrier metal layer 20 is formed on the surface of the interlayer insulating layer 15 including the inside of the hole H1. The first barrier metal layer 20 may be formed to inhibit a metal, such as the metal contact structure that is filled the hole H1, from diffusing to the active region of the substrate 10, the lower interconnect layer or another contact structure and/or to the interlayer insulating layer 15. Thus, the first barrier metal layer 20 may be formed of a stacked layer of a Ti layer and a TiN layer. After forming the Ti layer by CVD, PE-CVD and/or Atomic Layer Deposition (ALD), the Ti layer may be partially transformed to a TiN layer by annealing or plasma processing under $N_2$ or $NH_3$ gas ambient. In some embodiments of the present invention, the first barrier metal layer 20 may comprise a stacked layer of Ta and TaN, a single layer such as a Ti layer, a TiN layer, a Ta layer and a TaN layer, another metal layer and/or a metal nitride layer.

A metal layer 25 is deposited on the surface of the resultant structure formed with the first barrier metal layer 20. The metal layer 25 may include tungsten. Because an aspect ratio of the hole H1 is large, a seam 30 may be inadvertently formed in the metal layer 25.

Figure 3:
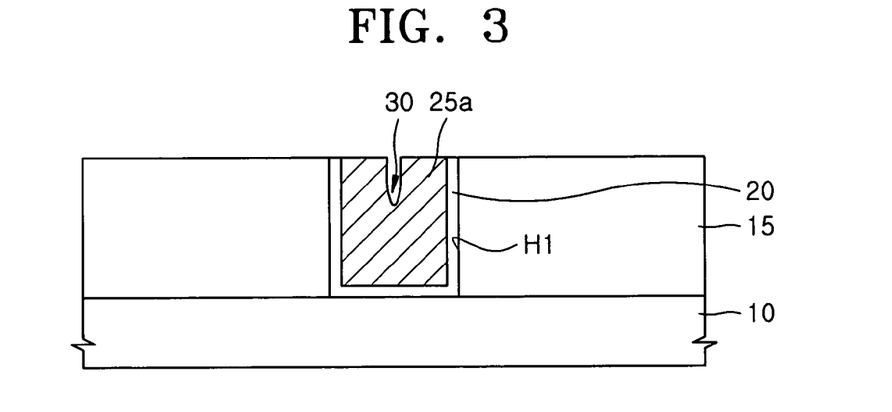
Figure 4:
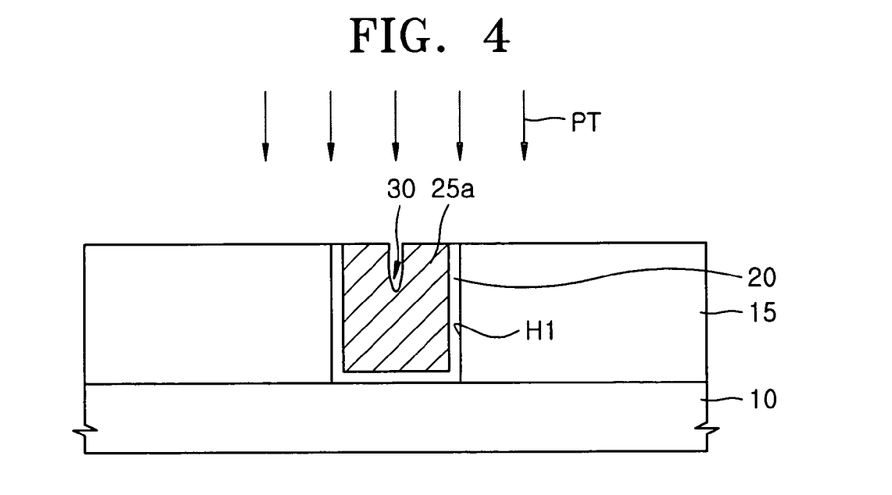

Referring to FIG. 3, the metal layer 25 is planarized to form a buried metal layer 25a in the hole H1, and remove portions of the metal layer 25 and first barrier meta layer 20 outside of the hole H1. In some embodiments, Chemical Mechanical Polishing (CMP) may be employed to planarize the metal layer 25. The first barrier metal layer 20 formed on the upper surface of the interlayer insulating layer 15 may also be polished so as to expose the upper surface of the interlayer insulating layer 15. Due to use of a polishing slurry when planarizing the metal layer 25, a polymer-induced impurity may exist on the surface of the metal layer 25a, which may affect process control, such as an etch rate, in a subsequent etchback. Accordingly, as shown in FIG. 4, a pre-treatment PT of the etchback, which eliminates the polymer-induced impurity, is performed. In order to eliminate the polymer-induced impurity, both or either one of ashing and radiating an RF plasma upon the surface of the metal layer 25a filled in the hole H1 are (is) performed. The RF plasma may be generated using Ar, for example.

Figure 5:
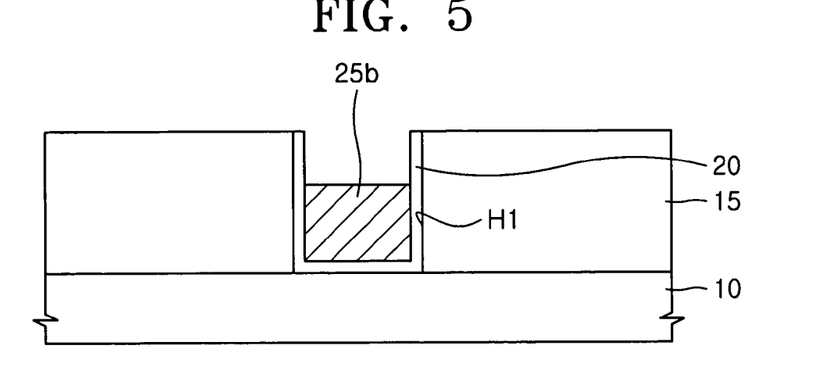

Referring to FIG. 5, the metal layer 25a filled in the hole H1 is subjected to an etchback such that a portion of the metal layer 25b remains within the hole H1. The pre-treatment PT of removing the polymer-induced impurity and the etchback may be performed in-situ. Etchback is continued until the seam 30 formed in the surface of the metal layer 25a is removed. More specifically, in some embodiments of the present invention, the metal layer 25a including tungsten is plasma-etched using an etchant including fluoride, such as $SF_6$ or $NF_3$. Because $SF_6$ or $NF_3$ gas slightly activates plasma, $Cl_2$ may be added to complement the plasma activation. Under this condition, the first barrier metal layer 20 formed within the hole H1 may not be etched through but may remain after the etchback.

Because the etchback is carried out with the surface of the metal layer 25a level with the substrate 10 as a result of planarizing the metal layer 25 using CMP, the etchback that removes the seam 30 can be easily controlled. Furthermore, although the upper surface of the metal layer 25b partially remaining within the hole H1 is parallel with the substrate 10 in the drawing, the upper surface of the metal layer 25b may have an uneven shape with a deeply hollowed portion where the seam 30 was formed.

Figure 6:
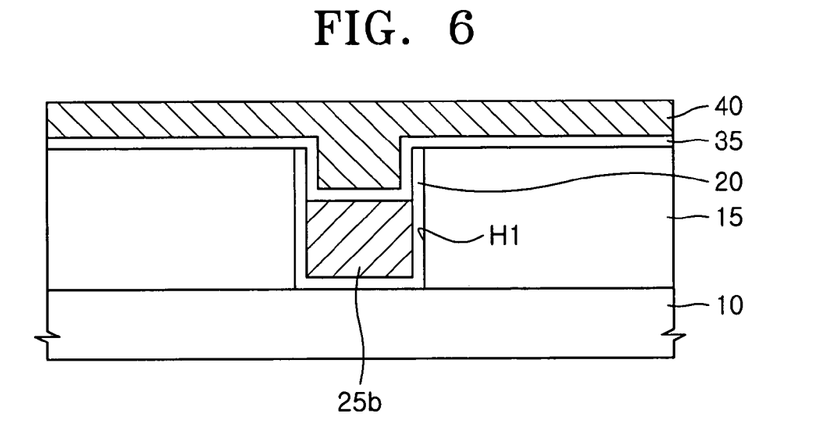

Referring to FIG. 6, a second barrier metal layer 35 is formed on the surface of the resultant structure subjected to etchback. Similar to the first barrier metal layer 20, the second barrier metal layer 35 may comprise a Ti layer, a TiN layer, a stacked layer of Ti and TiN, a Ta layer, a TaN layer, and/or a stacked layer of Ta and TaN.

Subsequently, a conductive layer 40 is deposited on the second barrier metal layer 35. The conductive layer 40 may comprise tungsten. If the conductive layer 40 is formed of a TiN layer, a TiAlN layer, a TaN layer or a combination of these in place of tungsten, no second barrier metal layer 35 may be required. Because the hole H1 to be filled by the conductive layer 40 becomes shallower by the thickness of the metal layer 25b, the hole H1 may be completely filled to have a favorable profile having no void or seam.

Figure 7:
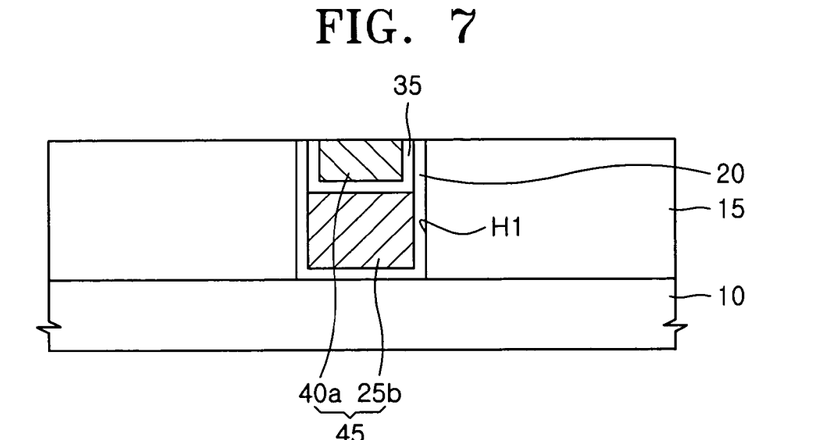

Referring to FIG. 7, the conductive layer 40 formed on the upper surface of the interlayer insulating layer 15 is removed by planarization, thereby forming a contact structure 45 formed of the metal layer 25b filled in the hole H1 and the conductive layer 40a. CMP may be preferable when planarizing the conductive layer 40. The second barrier metal layer 35 formed on the upper surface of the interlayer insulating layer 15 may also be polished with the conductive layer 40, thereby exposing the upper surface of the interlayer insulating layer 15.

In a subsequent process, an upper conductive layer with a predetermined pattern may be additionally formed on the contact structure 45.

In the embodiments described above, the metal contact structure 45 is formed by the deposition of the metal layer 25, the first CMP, the etchback, the deposition of the conductive layer 40, and the second CMP. Because the first CMP after depositing the metal layer 25 facilitates the control of the etchback, the seam formed in the metal layer 25 can be consistently removed. Also, removing the polymer-induced impurity may also be performed after the first CMP, thereby allowing for further accurate control of an etch rate during the etchback.

Figure 8:
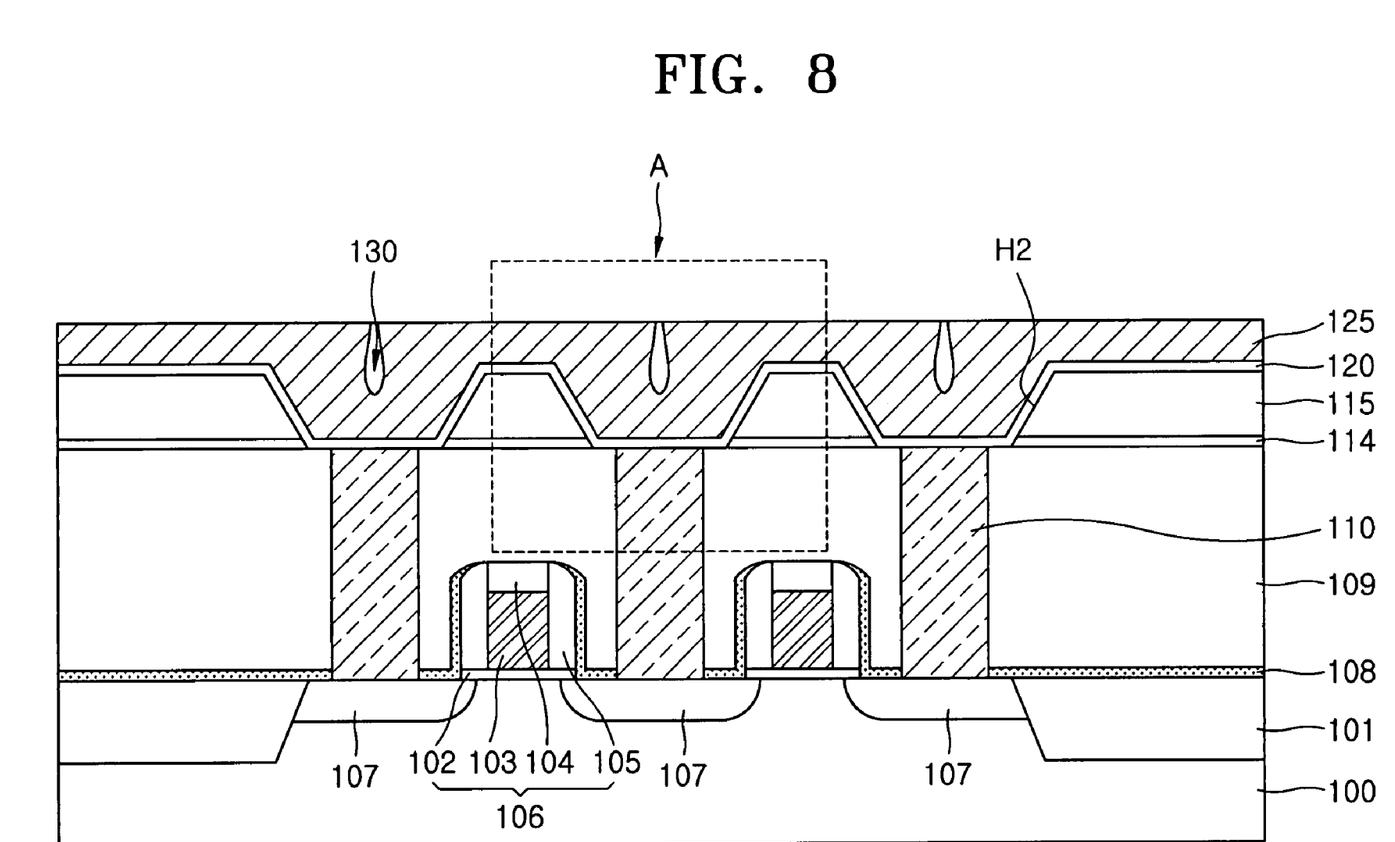
FIGS. 8 through 15 are sectional views showing methods of fabricating a phase-change memory according to further embodiments of the present invention.

FIGS. 8 through 15 are sectional views showing methods of fabricating phase-change memories according to further embodiments of the present invention, in which FIGS. 9 through 15 are views in enlargement of a portion A of FIG. 8.

In the embodiments illustrated in FIGS. 9 through 15, a phase-change memory is fabricated by forming a contact pad of the phase-change memory in accordance with the methods of forming the metal contact structure described above. Hereinafter, detailed steps of forming a metal pad, kinds of a metal layer and a conductive layer, methods of etching-back the metal layer, and kinds of a barrier metal layer formed before depositing the metal layer and/or the conductive layer may be provided as described above with reference to FIGS. 2 through 7.

Referring to FIG. 8, after forming a device isolating layer 101 for defining an active region on a substrate 100, such as a silicon wafer, a gate (word line) 106 including a gate insulating layer 102, a gate electrode 103, a capping layer 104 and spacers 105 is formed. An impurity diffusion region 107 is formed in the substrate 100 at both sides of the gate 106. A Co salicide process may be added for lowering a resistance of the diffusion region 107. In some embodiments, a single active region includes two phase-change memory cells commonly sharing a single common drain, and two transistors.

An etchstop layer 108 and an insulating layer 109 are formed on the substrate 100, and are patterned to expose the diffusion region 107. A metal such as tungsten is filled in the patterned insulating layer 109 and etchstop layer 108 to form a contact plug 110. The etchstop layer 108 may include a silicon nitride layer, and the insulating layer 109 may include a silicon oxide layer using BPSG, SOG, USG, FOX and an oxide layer formed by HDP-CVD, and an oxide layer formed by PE-CVD using TEOS.

A first interlayer insulating layer 115 is formed on the substrate 100 formed with the contact plug 110 thereon. A second etchstop layer 114 may be formed before forming the first interlayer insulating layer 115. The first interlayer insulating layer 115 may include a silicon oxide layer formed using BPSG, SOG, USG, FOX and/or an oxide layer formed by HDP-CVD, and/or an oxide layer formed by PE-CVD using TEOS. The first interlayer insulating layer 115 is etched to form a contact hole H2 that exposes the contact plug 110.

A first barrier metal layer 120 is formed on the surface of the first interlayer insulating layer 115 including inside the contact hole H2. The first barrier metal layer 120 may inhibit diffusion of a metal of the metal contact structure that fills the contact hole H2 to the diffusion region 107 of the substrate 100, the contact plug 110 and/or the first interlayer insulating layer 115. The first barrier metal layer 120 may include a Ti layer, a TiN layer, a stacked layer of Ti and TiN, a Ta layer, a TaN layer, and/or a stacked layer of Ta and TaN.

A metal layer 125 is deposited on the surface of the resultant structure having the first barrier metal layer 120. The metal layer 125 may include tungsten. When an aspect ratio of the contact hole H2 is large, a seam 130 may be formed in the metal layer 125.

Figure 9:
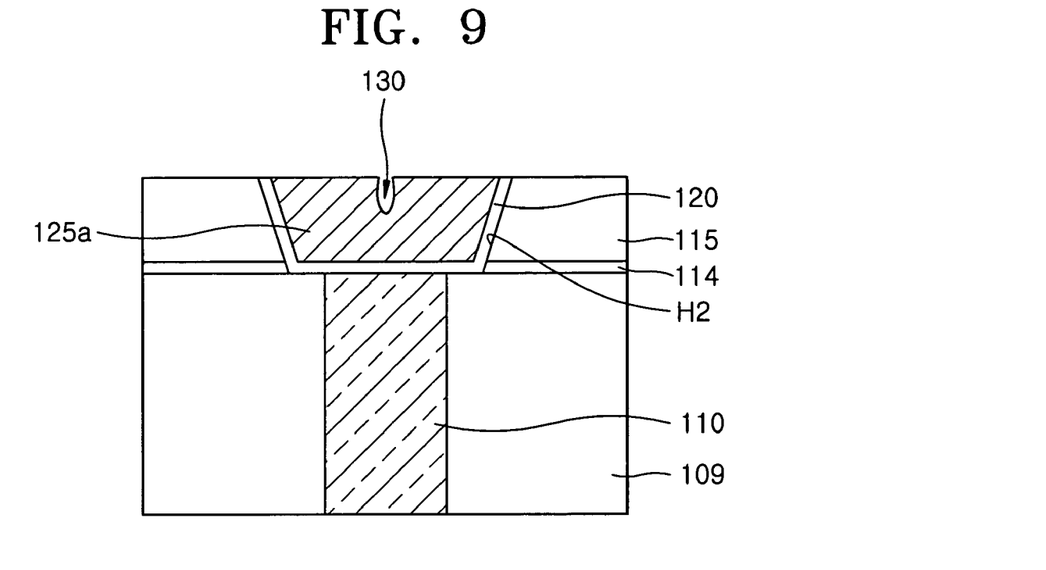

Referring to FIG. 9, the metal layer 125 is planarized, so that the buried metal layer 125a remains in the contact hole H2 but the portions of the metal layer 125 outside of the contact hole H2 are removed. CMP may be used when planarizing the metal layer 125. The first barrier metal layer 120 formed on the upper surface of the first interlayer insulating layer 115 is polished along with the metal layer 125, thereby exposing an upper surface of the first interlayer insulating layer 115.

Figure 10:
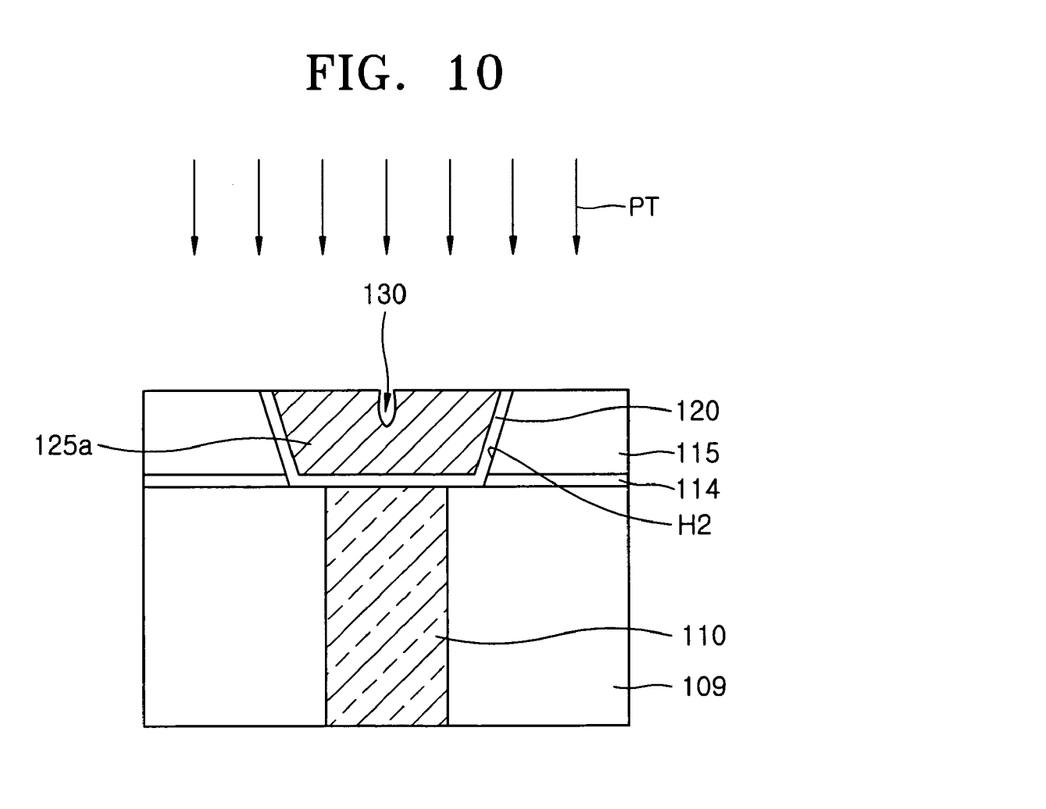

Referring to FIG. 10, a pre-treatment PT that removes a polymer-induced impurity existing on the surface of the metal layer 125a is performed. In order to remove the polymer-induced impurity, both or either one of ashing and radiating an RF plasma upon the surface of the metal layer 125a may be carried out.

Figure 11:
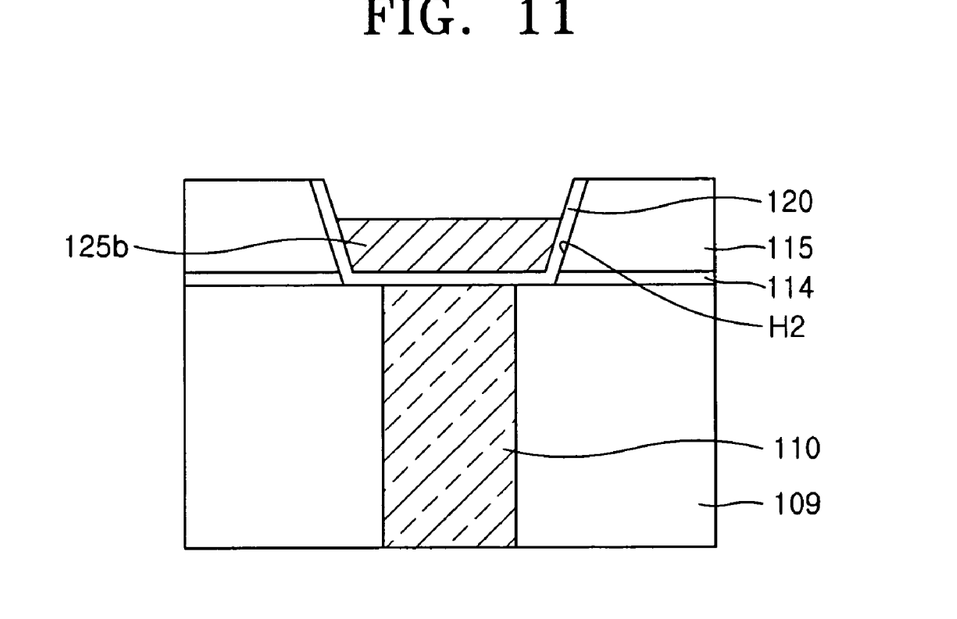

Referring to FIG. 11, the metal layer 125a filled the contact hole H2 is etched back to provide a remaining portion of the metal layer 125b within the contact hole H2. The pre-treatment PT of removing the polymer-induced impurity and the etchback may be performed in-situ. The etchback may be performed until the seam 130 formed on the surface of the metal layer 125a is removed. More specifically, in some embodiments of the present invention, the metal layer 125a including tungsten is plasma-etched using an etchant including fluoride, such as $SF_6$ or $NF_3$. Because $SF_6$ or $NF_3$ gas slightly activates plasma, $Cl_2$ may be added to complement the plasma activation. If a depth of the contact hole H2 ranges 2000~2500 Å, it is recessed down to approximately 1500 Å. Under this condition, the first barrier metal layer 120 formed within the contact hole H2 may not be substantially etched but may be left.

Because the etchback is carried out with the surface of the metal layer 125a level with the substrate 100 as a result of planarizing the metal layer 125 using CMP, etchback can be easily controlled.

Figure 12:
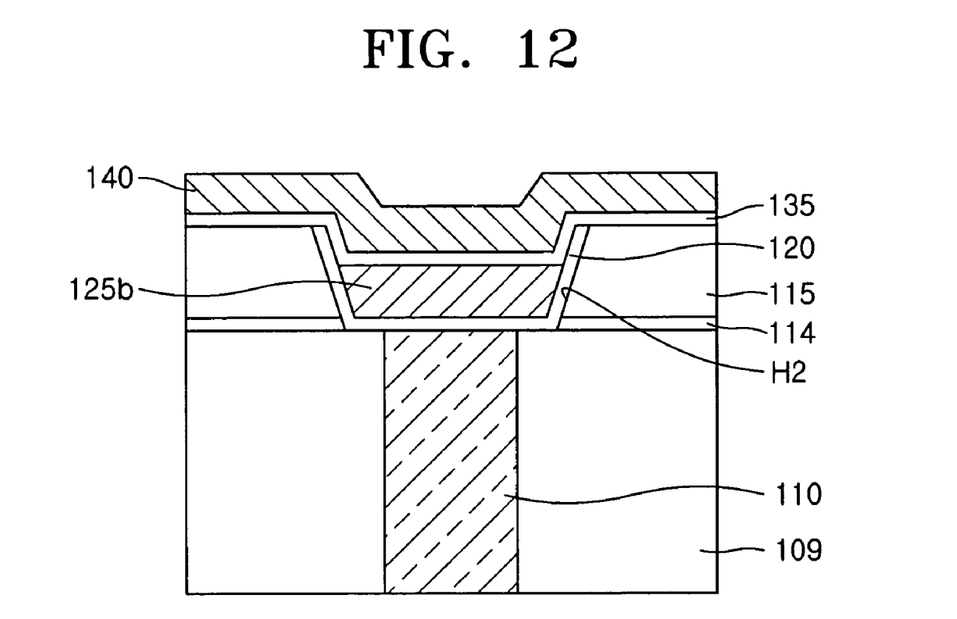

Referring to FIG. 12, a second barrier metal layer 135 is formed on the surface of the resultant structure subjected to etchback. Similar to the first barrier metal layer 120, the second barrier metal layer 135 may include a Ti layer, a TiN layer, a stacked layer of Ti and TiN, a Ta layer, a TaN layer, and/or a stacked layer of Ta and TaN.

Subsequently, a conductive layer 140 is deposited on the second barrier metal layer 135. The conductive layer 140 may include a conductive material capable of enduring a high current density and which does not degrade an upper electrode layer and a phase-change layer. For example, the conductive layer 140 may include tungsten. When the conductive layer 140 is formed of a TiN layer, a TiAlN layer, a TaN layer or a combination of these in place of tungsten, no second barrier metal layer 135 is required. Because the contact hole H2 to be filled becomes shallower already as a result of the presence of the metal layer 125b, the contact hole H2 may be completely filled without having no void or seam. When a depth of the contact hole H2 is 2000~2500 Å and the metal layer 125a is recessed down to 1500 Å or so, a total thickness of the second barrier metal layer 135 and the conductive layer 140 should be about 2000 Å.

Figure 13:
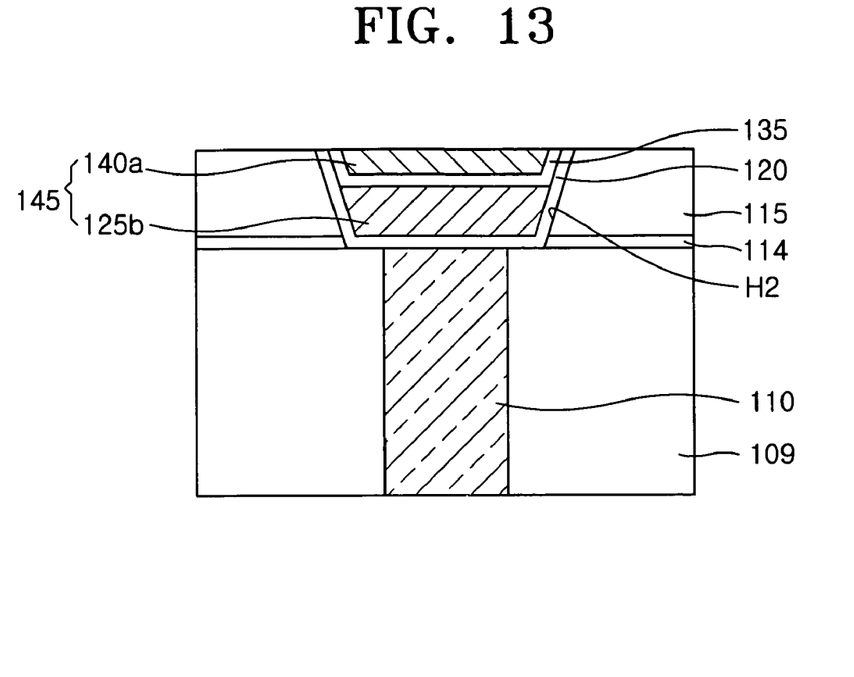

Referring to FIG. 13, the conductive layer 140 formed on the upper surface of the first interlayer insulating layer 115 is removed and planarized, thereby forming a contact pad 145 formed of the metal layer 125b filled in the contact hole H2 and the conductive layer 140a. CMP may be used when planarizing the conductive layer 140. The second barrier metal layer 135 formed on the upper surface of the first interlayer insulating layer 115 and the conductive layer 140 may be polished together, thereby exposing the upper surface of the interlayer insulating layer 115.

After a second interlayer insulating layer 150 is formed on the first interlayer insulating layer 115, including the contact pad 145, a lower electrode contact hole H3 is formed in the second interlayer insulating layer 150. Because of the suppression of a seam in the contact pad 145, the lower electrode contact hole H3 may be disposed in the center of the contact pad 145. Therefore, it may be possible to provide an on-axis lower electrode contact structure. The second interlayer insulating layer 150 may also include a silicon oxide layer formed via BPSG, SOG, USG, FOX, an oxide layer formed by HDP-CVD, an oxide layer formed by PE-CVD using TEOS, and so on.

Figure 14:
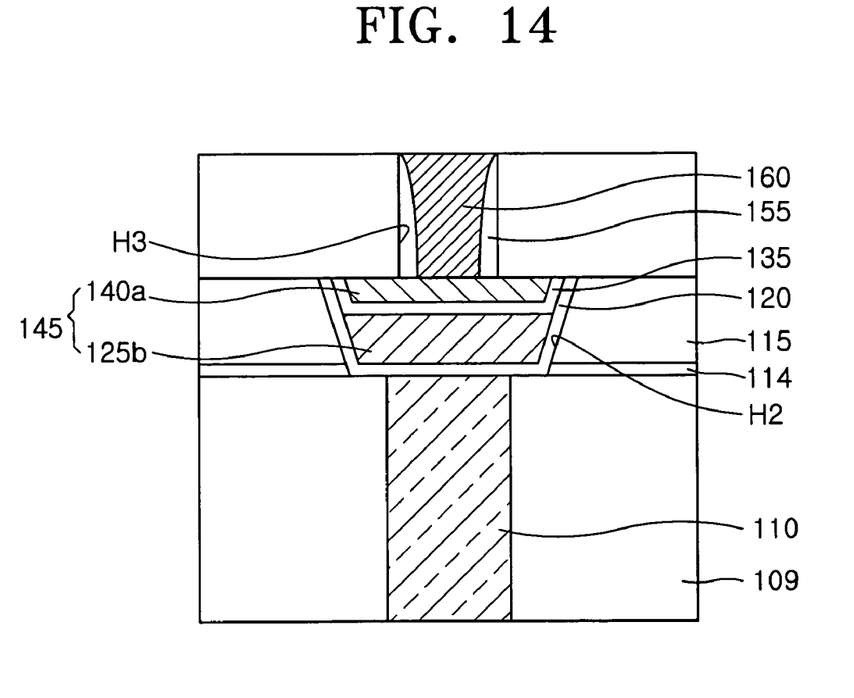

As the diameter of the lower electrode contact is smaller, power dissipation needed for transforming the phase-change layer into an amorphous state or a crystalline state may be decreased, thereby decreasing power dissipation of the phase-change memory. Accordingly, it is preferable that the lower electrode contact hole H3 is formed to have a narrower width. However, if photolithography process has restrictions, an insulating layer spacer 155 may be formed along an inside wall of the lower electrode contact hole H3 to narrow the width. By adjusting a size of the spacer 155, the contact may have a dimension of 40~70 nm.

A stacked layer of Ti and TiN is formed on the surface of the second interlayer insulating layer 150, and is planarized by CMP, etc. The stacked layer is buried in the lower electrode contact hole H3, thereby forming a lower electrode contact 160. Alternatively, other materials may be used in place of the stacked layer of Ti and TiN, such as a TaN layer, a WN layer, a TiSiN layer, a TiAlN layer, a TiBN layer, a TaSiN, and/or a TaAlN layer may be formed.

Figure 15:
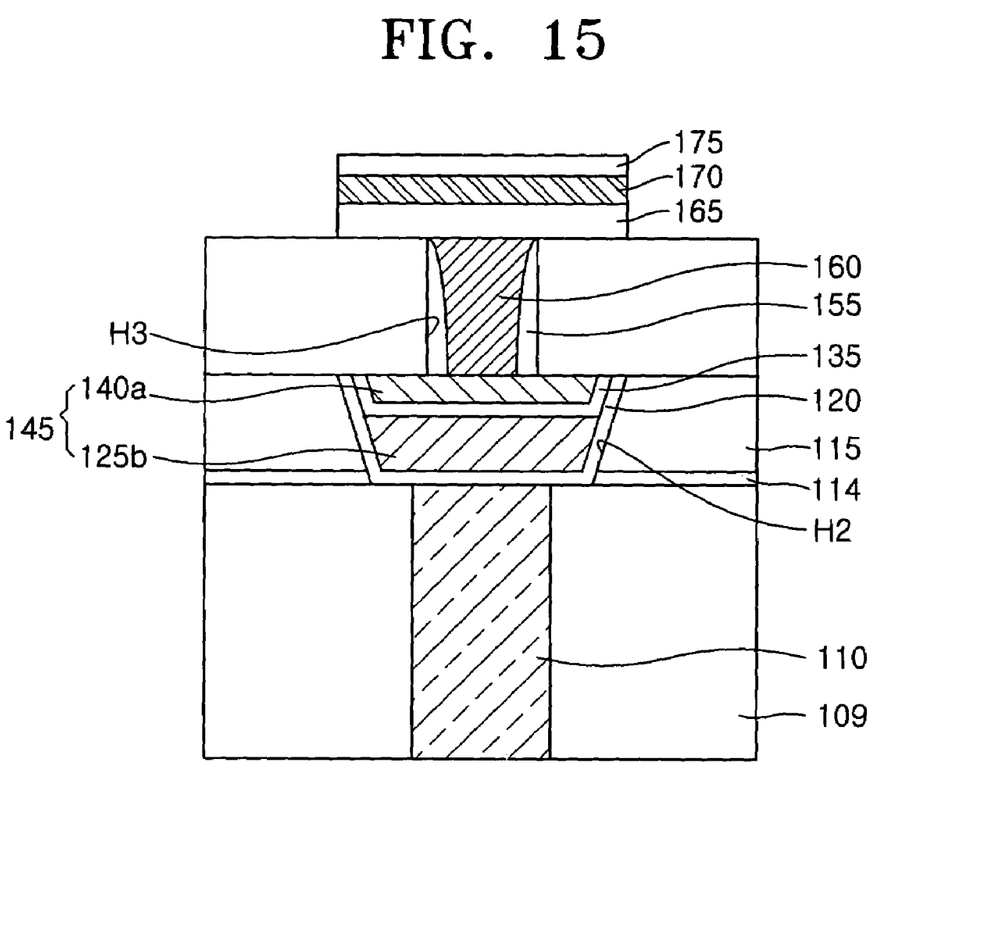

Referring to FIG. 15, a phase-change layer 165, an upper electrode layer 170 and an upper electrode contact layer 175 are sequentially formed on the lower electrode contact 160 and are patterned to fabricate the phase-change memory. A diffusion blocking layer may be added between the phase-change layer 165 and the upper electrode layer 170. The diffusion blocking layer may include a conductive layer for reducing or even preventing the phase-change layer 165 from reacting to the upper electrode layer 170. The diffusion blocking layer may, for example, be a metal nitride layer. The metal nitride layer may be a TiN layer, a TiAlN layer, a TiBN layer, a TiSiN layer, a TaN layer, a TaAlN layer, a TaBN layer, a TaSiN layer, a WN layer, a WBN layer, a WSiN layer, a WAlN layer, a ZrN layer, a ZrSiN layer, a ZrAlN layer, a ZrBN layer and/or a MoN layer. The phase-change layer 165 state is changed in accordance with a heating temperature to change a resistance. For example, a material usable for the phase-change layer 165 includes GaSb, InSb, InSe, $Sb_2Te_2$ and GeTe as a binary compound, $Ge_2Sb_2Te_5$, InSbTe, GaSeTe, $SnSb_2Te_4$ and InSbGe as a ternary compound, and/or AgIb-SbTe, (Ge, Sn)SbTe, GeSb(SeTe) as a quaternary compound.

Current flows from the lower electrode contact 160 to the upper electrode contact layer 175 via the phase-change layer 165. Using heating by Joule heating and cooling by current cutoff, the phase-change occurs at an interface of the phase-change layer 165 and the lower electrode contact 160.

Because the lower electrode contact 160 is formed on the contact pad 145 where the generation of the seam is suppressed, the conventional problems such as a resistance error may be avoided. Consequently, an operating speed of the phase-change memory may be increased, a contact resistance may be decreased to improve characteristics and reliability, and yield of manufacturing may be enhanced.

In the methods of fabricating the metal contact structure according to some embodiments of the present invention as described above, the metal layer deposition, the etchback after CMP, and the conductive layer deposition are added to have an effect of decreasing a void or a seam. By doing so, an operating speed of a semiconductor device such as a phase-change memory may be increased, contact resistance may be decreased to improve characteristics and reliability of the semiconductor device, and yield of manufacturing may be enhanced.

Because a seam generated in a metal pad is suppressed, in, for example, the case of a phase-change memory, an on-axis lower electrode contact structure, in which a lower electrode contact is connected to the center of the upper surface of the metal pad, can be provided. Thus, there may be no need to utilize an off-axis lower electrode contact structure that may complicate the fabrication process. Furthermore, the on-axis lower electrode contact structure may simplify fabrication and may allow for integrating the phase-change memory with a high packing density.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a phase-change memory comprising:
   forming a first interlayer insulating layer on a substrate having a contact plug;
   etching the first interlayer insulating layer to form a contact hole that exposes the contact plug;
   depositing a metal layer on the surface of the first interlayer insulating layer including inside of the contact hole;
   planarizing the metal layer to provide a buried portion of the metal layer in the contact hole and to remove portions of the metal layer outside of the contact hole;
   etching-back the buried portion of the metal layer in the hole such that some of the buried portion of the metal layer within the hole remains;
   depositing a conductive layer on the surface of the first interlayer insulating layer and the metal layer that remains within the hole to substantially fill the hole;
   planarizing the conductive layer to remove portions of the conductive layer formed on an upper surface of the first interlayer insulating layer to provide a contact pad comprising the metal layer that remains within the hole and the conductive layer in the contact hole;
   forming a second interlayer insulating layer on the first interlayer insulating layer including the contact pad;
   forming a lower electrode contact in the second interlayer insulating layer and in contact with an upper surface of the contact pad; and
   sequentially forming a phase-change layer, an upper electrode layer and an upper electrode contact layer on the lower electrode contact.

2. The method of claim 1, wherein planarizing the metal layer and planarizing the conductive layer are carried out by Chemical Mechanical Polishing (CMP).

3. The method of claim 1, wherein the metal layer comprises tungsten, and the conductive layer comprises W, TiN, TiAlN and/or TaN.

4. The method of claim 1, wherein planarizing the metal layer is followed by:
   removing a polymer-induced impurity existing on a surface of the metal layer filled in the contact hole.

5. The method of claim 4, wherein removing the polymer-induced impurity comprises:
   ashing the polymer-induced impurity and/or irradiating an RF plasma on the surface of the metal layer filled in the contact hole.

6. The method of claim 4, wherein removing the polymer-induced impurity and etching-back the metal layer in the contact hole are performed in-situ.

7. The method of claim 1, wherein the metal layer comprises tungsten, and etching-back the metal layer comprises plasma etching using $SF_6$ or $NF_3$ as an etchant.

8. The method of claim 7, wherein $Cl_2$ is added to the etchant.

9. The method of claim 1, wherein the metal layer is etched-back until a seam generated in the surface of the metal layer is removed.

10. The method of claim 1, wherein depositing the metal layer is preceded by forming a barrier metal layer on the surface of the first interlayer insulating layer including inside of the contact hole and wherein depositing the metal layer comprises depositing the metal layer on the barrier metal layer.

11. The method of claim 10, wherein the barrier metal layer comprises a Ti layer, a TiN layer, a stacked layer of Ti and TiN, a Ta layer, a TaN layer and/or a stacked layer of Ta and TiN.

12. The method of claim 10, wherein depositing the conductive layer is preceded by forming a second barrier metal layer on the surface of the first interlayer insulating layer and the portion of the metal layer that remains within the hole and wherein depositing the conductive layer comprises depositing the conductive layer on the second barrier layer.

13. The method of claim 12, wherein the second barrier metal layer comprises a Ti layer, a TiN layer, a stacked layer of Ti and TiN, a Ta layer, a TaN layer and/or a stacked layer of Ta and TiN.

14. A method of claim 1, wherein forming the lower electrode contact comprises:
   forming a lower electrode contact hole in the second interlayer insulating layer;
   forming a stacked layer of Ti and TiN on the surface of the second interlayer insulating layer including in the lower electrode contact hole; and
   planarizing the stacked layer of Ti and TiN to provide a portion of the stacked layer of Ti and TiN in the lower electrode contact hole.

15. A method of claim 14, wherein forming the stacked layer of Ti and TiN is preceded by forming an insulating layer spacer along an inner wall of the lower electrode contact hole.

* * * * *